US010761140B2

(12) United States Patent
Frank et al.

(10) Patent No.: US 10,761,140 B2
(45) Date of Patent: Sep. 1, 2020

(54) METHOD FOR PRODUCING A SEMICONDUCTOR DEVICE BY MEANS OF COMPUTER-AIDED DEVELOPMENT OF TEST SCENARIOS

(71) Applicant: Infineon Technologies AG, Neubiberg (DE)

(72) Inventors: Oliver Frank, Linz (AT); Christoph Hazott, Linz (AT); Georg Krebelder, Ottensheim (AT); Bruno Mariacher, Finkenstein (AT); Otto Pfabigan, Villach (AT); Sebastian Pointner, Weng im Innkreis (AT); Ralf Reiterer, Linz (AT); Florian Starzer, Ennsdorf bei Enns (AT)

(73) Assignee: Infineon Technologies AG, Neubiberg (DE)

( * ) Notice: Subject to any disclaimer, the term of this patent is extended or adjusted under 35 U.S.C. 154(b) by 84 days.

(21) Appl. No.: 16/038,223

(22) Filed: Jul. 18, 2018

(65) Prior Publication Data
US 2019/0033373 A1 Jan. 31, 2019

(30) Foreign Application Priority Data

Jul. 31, 2017 (DE) ......................... 10 2017 117 322

(51) Int. Cl.
| | |
|---|---|
| *G01R 31/319* | (2006.01) |
| *G06F 30/33* | (2020.01) |
| *G06F 30/327* | (2020.01) |
| *G01R 31/317* | (2006.01) |
| *H01L 21/66* | (2006.01) |

(52) U.S. Cl.
CPC . *G01R 31/31908* (2013.01); *G01R 31/31713* (2013.01); *G06F 30/327* (2020.01); *G06F 30/33* (2020.01); *H01L 22/20* (2013.01)

(58) Field of Classification Search
None
See application file for complete search history.

(56) References Cited

U.S. PATENT DOCUMENTS

| | | | |
|---|---|---|---|
| 7,139,955 B2 | 11/2006 | Rohrbaugh et al. | |
| 7,340,661 B2 | 3/2008 | Groz | |
| 2002/0040288 A1* | 4/2002 | Yamoto | G01R 31/318314 703/17 |
| 2008/0120082 A1* | 5/2008 | Alexanian | G01R 31/318314 703/14 |

FOREIGN PATENT DOCUMENTS

| | | |
|---|---|---|
| DE | 102013212839 A1 | 1/2015 |
| EP | 2824597 A1 | 1/2015 |

* cited by examiner

*Primary Examiner* — Jas A Sanghera
(74) *Attorney, Agent, or Firm* — Harrity & Harrity, LLP

(57) ABSTRACT

A method for producing a semiconductor device is described. In accordance with one example embodiment, the method comprises providing a virtual DUT in the form of a behavior model of the semiconductor device and developing at least one test in a test development environment for an automatic test equipment (ATE). In this case, commands are generated by means of the test development environment, which commands are converted into test signals by means of a software interface, which test signals are fed to the virtual DUT and are processable by the latter. The software interface processes response signals of the virtual DUT and reports information dependent on the response signals back to the test development environment.

20 Claims, 4 Drawing Sheets

METHOD FOR PRODUCING A SEMICONDUCTOR DEVICE BY MEANS OF COMPUTER-AIDED DEVELOPMENT OF TEST SCENARIOS

RELATED APPLICATION

This application claims priority under 35 U.S.C. § 119 to German Patent Application No. 102017117322.6, filed on Jul. 31, 2017, the content of which is incorporated by reference herein in its entirety.

TECHNICAL FIELD

The present disclosure relates to the field of the development and production of semiconductor devices, and, in particular, to a method which allows test scenarios for testing prototypes to be developed before the prototypes are actually produced.

BACKGROUND

In many types of semiconductor devices, tests are necessary at the end of production (End-of-Line tests, EOL tests). Tests of this type have the aim firstly of checking the functionality of the devices (chips) produced and secondly of characterizing and possibly calibrating components contained in the devices. A test station for an EOL test usually comprises an automatic test equipment (ATE) that is able to carry out various tests fully automatically on a wafer (or on the individual chips after singulation). A test scenario comprises for example generating test signals by means of the ATE, feeding the test signals into the device under test (DUT) and detecting and evaluating the associated response signals of the DUT.

In many cases, specific test scenarios have to be developed for a particular batch of semiconductor devices. A developer usually develops suitable test sequences (a test scenario) with the aid of a real ATE and using a prototype of the devices under test (DUTs). Developing test scenarios takes up an appreciable time and can significantly prolong the time period between prototype production and delivery of the series products.

SUMMARY

According to some implementations, a method for producing a semiconductor device is provided. In accordance with one example embodiment, the method comprises providing a virtual DUT in the form of a behavior model of the semiconductor device and developing at least one test in a test development environment for an automatic test equipment (ATE). In this case, commands are generated by means of the test development environment, which commands are converted into test signals by means of a software interface, which test signals are fed to the virtual DUT and are processable by the latter. The software interface processes response signals of the virtual DUT and reports information dependent on the response signals back to the test development environment.

According to some implementations, a system for testing a semiconductor device is provided. In accordance with one example embodiment, the system comprises a virtual device under test (DUT) in the form of a behavior model of the semiconductor device, said behavior model being executed on at least one processor, and a test development environment, executed on a workstation, for an automatic test equipment (ATE) for programming at least one test. The system furthermore comprises a software interface configured to emulate the behavior of the ATE, wherein commands generated by means of the test development environment are converted into test signals which are fed to the virtual DUT and are processable by the latter. The software interface is further configured to process response signals of the virtual DUT and to report information dependent on the response signals back to the test development environment.

Some implementations, described herein, shorten the time before the start of series production (start of production, SOP), such as the time between preproduction series and SOP, relative to prior methods and systems.

BRIEF DESCRIPTION OF THE DRAWINGS

The invention can certainly be better understood with reference to the following drawings and descriptions. The components illustrated in the drawings are not necessarily true to scale; rather, importance is attached to elucidating the principle underlying the invention. Furthermore, in the drawings, identical reference signs designate corresponding parts. With regard to the drawings.

DETAILED DESCRIPTION

For testing wafers and (after singulation) semiconductor chips in so-called End-of-Line tests (EOL tests), systems are used which are usually referred to as "automatic test equipment" (ATE). An ATE comprises both hardware and software and comprises all components required for carrying out a test on a wafer, a semiconductor chip or a semiconductor module (device under test, DUT), such as, for example, signal generators (test pattern generators, etc.), amplifiers, digital interfaces, contact devices for making contact with a DUT (sockets, contact pins, etc.), and the like. The test signals generated by the ATE are fed to the DUT, and the associated response signals are detected and evaluated by the ATE. ATEs for wafers, semiconductor chips, or semiconductor modules are commercially available (e.g. from Teradyne) and are therefore not explained in any further detail.

For a particular type or a particular batch of wafers, semiconductor chips, or semiconductor modules, generally a specific test scenario (i.e. a sequence of a plurality of tests) is developed which is intended to be applied in later series production during an EOL test. The result of a test may be not only "passed" or "failed" but also a parameter value that is used for the calibration of a component contained in the DUT. This calibration can be regarded as part of the test scenario and be carried out by means of the ATE. An ATE can usually be operated and programmed by means of specific software. Part of this software is referred to here as test development environment, with the aid of which a test engineer can program the desired tests on the computer. For the test development, in particular for the proof of the function of a previously developed test (of a test sequence or of a test program), a prototype is required as device under test (DUT). This may be a piece of hardware (e.g. a Field Programmable Gate Array (FPGA), an older semiconductor generation, etc.). The test engineer can already see in the test development environment whether a test just programmed yields the desired result. This feedback from the DUT (prototype) to the test development environment is necessary for an expedient development of test scenarios in order to be able to validate the programmed tests. In the case of an ATE from Teradyne, for example, the test development environment is the integrated development environment (IDE) having the designation IG XL.

Figure 1:
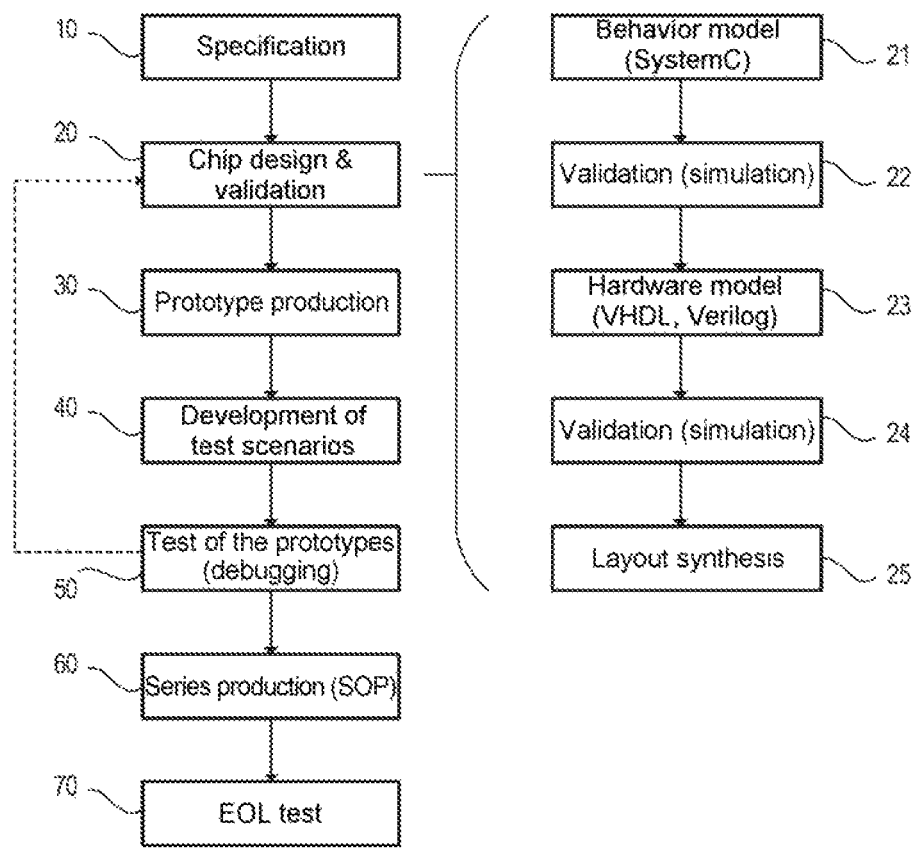
FIG. 1 is a flow diagram for illustrating by way of example the process of chip development until the start of series production.

FIG. 1 shows a flow diagram illustrating, by way of example, the process of chip development until the start of series production. The development begins with a specification defining the features/capabilities desired of the product (FIG. 1, step 10). Afterward, the chip design is created and validated (FIG. 1, step 20). The result of the chip design is generally a hardware model defined by means of a hardware description language such as e.g. VHDL or Verilog. On the basis of the hardware model, the chip layout can be synthesized and a prototype can be produced (FIG. 1, step 30). A test scenario is then developed as described above with the aid of a prototype coupled to an ATE. The prototypes can then be tested (FIG. 1, step 50), wherein the chip design can still be adapted at this stage of development in order to eliminate bugs in the chip design that have been found in the course of testing. After a successful test of the prototypes, series production of the wafers, semiconductor chips, or modules can begin (FIG. 1, step 60), wherein the above-mentioned EOL tests (FIG. 1, step 70) are carried out at the end of series production.

Chip design and validation (FIG. 1, step 20) is usually carried out in at least two stages, wherein firstly a behavior-based model is created (FIG. 1, step 21), which substantially represents the function of the semiconductor chip or module. Modeling languages are known for this purpose, wherein SystemC is often used in the field of chip design. In actual fact, SystemC is not an independent modeling language, but rather a collection of libraries for the C++ programming language. A modeling language such as SystemC is also suitable for the simulation of the model and thus also for the validation of the function of the chip design (FIG. 1, step 22).

In a second stage, the behavior-based model is converted into a hardware model (FIG. 1, step 23), which is generally based on a hardware description language (HDL). One HDL that is used very frequently is VHDL (Very high speed integrated circuit Hardware Description Language). VHDL allows a simulation/validation (FIG. 1, step 24) at a lower abstraction level than SystemC. A VHDL hardware model can be capable of synthesis and be converted by a synthesis tool (fully automatically or semi-automatically) into a netlist and a chip layout (FIG. 1, step 24). The first prototypes can be produced on the basis of the chip layout, as mentioned above.

As already mentioned and as illustrated in FIG. 1, an ATE and a prototype of the DUT (wafer, semiconductor chip, semiconductor module, etc.) are required for the development of a test scenario, which shifts the development of the tests (and also testing/debugging of the prototypes themselves) to a late phase of the process (to the "post-silicon phase", that is to say after the first prototypes have been produced). The time required for the entire process can be shortened if the steps shown in FIG. 1 could be at least partly parallelized.

Figure 2:
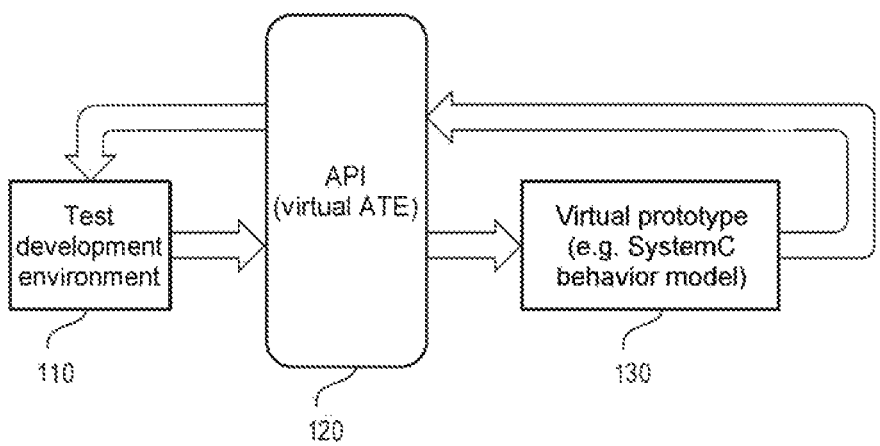
FIG. 2 shows one example of a system for developing test scenarios for EOL tests on a virtual prototype by means of a virtual ATE.

FIG. 2 shows one example of a system for developing test scenarios for EOL tests. In accordance with the present example, the tests are not developed on the basis of a real prototype, but rather on the basis of a "virtual prototype", which is represented for example by the behavior-based model of the DUT (cf. FIG. 1, step 21). In the present example, the virtual prototype 130 is represented by a SystemC model of the DUT. Although model-based testing per se is known, it would be desirable for the developed tests to be implementable later using a real ATE. That is to say that the test engineer who develops the test scenarios has to do this in the test development environment 110 associated with the ATE. In the test development environment 110 (e.g. Teradyne IG-XL), the programming of a test substantially comprises defining control commands for the ATE, which then generates corresponding (digital and/or analog) test signals in accordance with the control commands, said test signals being fed to the (real) DUT. The sequence of control commands produces a test sequence or a test program. The ATE processes the response signals obtained from the DUT and feeds the desired information (e.g. signal frequency) back to the test environment 110. If it were then desired to carry out the test development on a virtual DUT (virtual prototype), a virtual ATE is also required, which is configured to convert the control commands generated by the test development environment into test signals that can be processed by the virtual DUT (e.g. a SystemC model of the DUT). Conversely, the response signals of the virtual DUT have to be processed and the information extracted from the signals has to be reported back to the test development environment 110. The control commands designate e.g. a signal frequency (and/or other signal parameters, such as e.g. phase, frequency change, etc.) with which the (virtual) ATE is intended to generate a test signal for the (virtual) DUT. In one simple case, the response signals supplied by the DUT are merely brought into the data format required by the test development environment (e.g. the sample rate and the word width (in bits) can be adapted) and the signal waveforms of the response signals of the DUT are made available to the test development environment.

In order to make this possible, the ATE hardware is also "virtualized" for the test development, i.e. by a software interface 120 between test development environment 110 and a virtual prototype 130. The software interface 120 is accordingly configured to emulate the behavior of the ATE hardware. That is to say that the software interface 120 receives digital commands from the test development environment 110 executed (e.g. on a personal computer) and converts said commands into test signals suitable for the virtual prototype 130 (e.g. the SystemC model). The response signals generated by the virtual prototype 130 are fed back to the software interface 120, and the latter converts the response signals (or information extracted therefrom, such as e.g. signal frequency, etc.) once again into a format that is readable for the test development environment 110. In this way, the software interface 120 models the ATE. The software interface 120 can e.g. also comprise a programming interface (application programming interface, API) between the test development environment 110 (e.g. Teradyne IG-XL) and virtual prototype 130 (e.g. SystemC model). With the system in accordance with FIG. 2, for the test engineer it makes no difference whether a test scenario is developed with a real ATE and a real DUT (wafer, chip, etc.) or with the software interface 120 and e.g. a SystemC model as virtual prototype.

Figure 3:
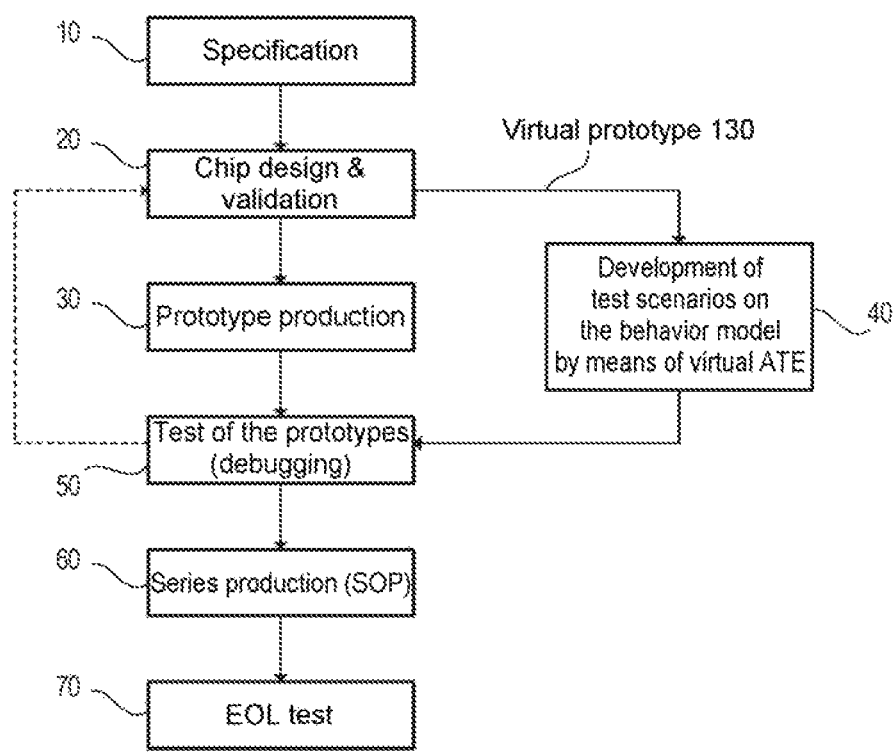
FIG. 3 is a flow diagram for illustrating an improved process of chip development, which involves developing test scenarios for EOL tests on a virtual prototype with a virtual ATE.

FIG. 3 shows, on the basis of a flow diagram, one example of a process that illustrates chip development until the start of series production, wherein the process has been improved insofar as the development of test scenarios manages without a real prototype and can therefore be brought forward to the "pre-silicon phase" (that is to say before the completion of the first prototypes). The development begins, as in FIG. 1, with the specification defining the features/capabilities desired of the product (FIG. 3, step 10). Afterward, the chip design is created and validated (FIG. 3, step 20). The result of the chip design is generally a hardware model defined by means of a hardware description language such as e.g. VHDL or System Verilog. On the basis of the hardware model, the chip layout can be synthesized and a prototype can be produced (FIG. 3, step 30). During the chip design, a behavior-based model is generally also created (cf. FIG. 1), which can be used as a virtual prototype for the development of a test scenario (FIG. 3, step 40). The actual development of the test scenario is carried out with the aid of the system from FIG. 2 using the customary test development environment 110 and the software interface 120 (virtual ATE). Since a real prototype is not required for the test development, step 40 can be brought forward in comparison with the example from FIG. 1 and be carried out before or during the production of the prototypes. Steps 40, 50 and 60 are the same as in the example from FIG. 1 and are therefore not repeated here.

Figure 4:
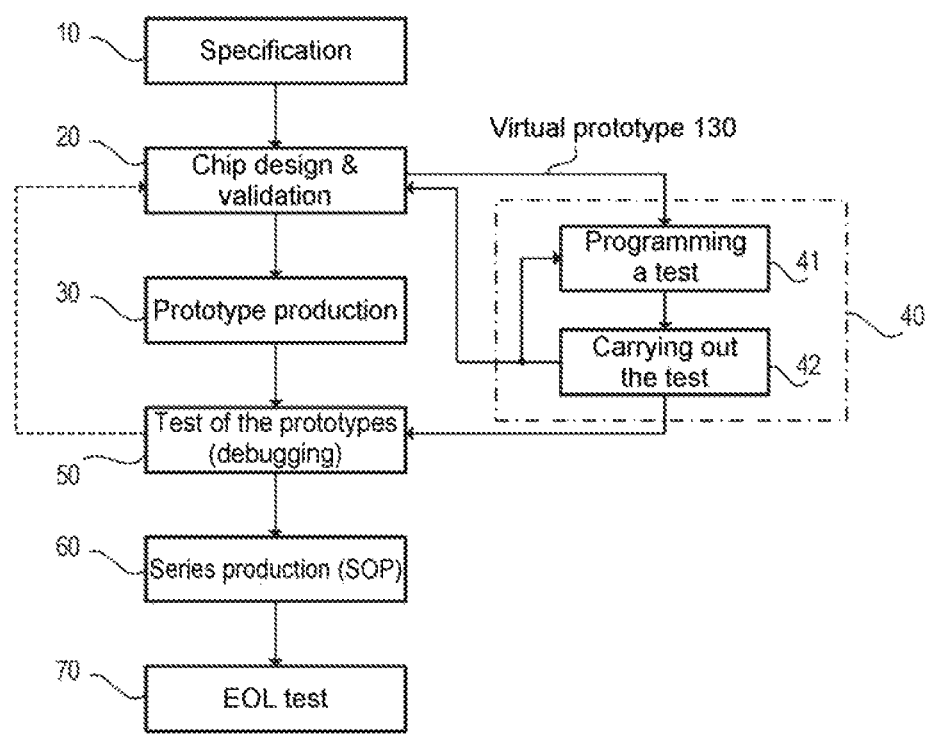
FIG. 4 is a flow diagram illustrating an extended variant of the example from FIG. 3.

The example in FIG. 4 is an extended variant of the example from FIG. 3. The development of a test substantially consists of the programming of a test sequence (e.g. a test signal with rising frequency, see FIG. 4, step 41) and the performance of the test (see FIG. 4, step 42) in order to check whether the response signal supplied by the virtual prototype corresponds to the desired result. At this juncture, there is also already the possibility of identifying bugs in the virtual prototype 130 (e.g. in the SystemC model) and modifying the chip design in order to eliminate the bugs in the model (and thus in the virtual prototype) (see FIG. 4, arrow from step 42 back to step 20). With the procedure described here, it is already possible to modify the chip design before the first real prototype has been produced.

The system in accordance with FIG. 2 and the procedure shown in FIG. 4 not only enable generation of test scenarios which are able to be used later both for testing the real prototype and for EOL tests in series production with a real ATE, but also enable testing/debugging on the virtual prototype (behavior model e.g. SystemC model) and thus partly bringing forward testing/debugging to the pre-silicon phase. At this juncture, it should be pointed out that this testing/debugging should not be confused with the simulation/validation of the behavior model (cf. FIG. 1, step 22) in the design phase. Realistic testing and debugging of the model become possible only as a result of the feedback of the response signals supplied by the virtual prototype to the test development environment (e.g. Teradyne IG-XL).

As already mentioned, the test development environment 110 (see FIG. 2) can be part of an integrated development environment (IDE) that generally originates from the manufacturer of the ATE hardware. The IDE is a software tool that is executed for example on a workstation (e.g. a personal computer). The software interface 120 (virtual ATE, see FIG. 2) can be executed on the same workstation as the test development environment 110 or on a different workstation that is connected to the workstation that executes the test development environment 110 via a computer network.

Figure 5:
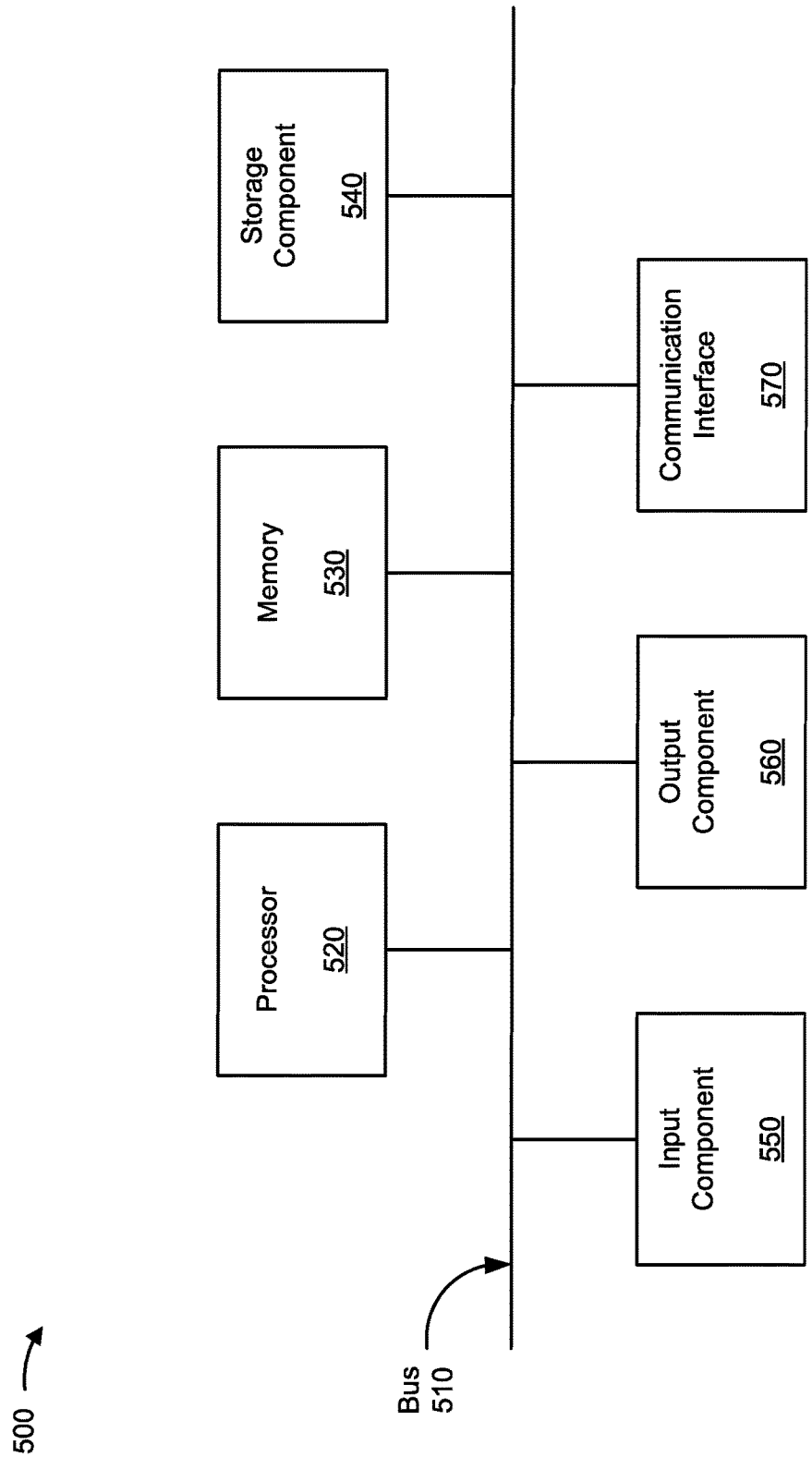
FIG. 5 is a diagram of example components of a device that can be used for systems and processes described herein.

FIG. 5 is a diagram of example components of a device 500 that can be used for systems and processes described herein. As shown in FIG. 5, device 500 may include a bus 510, a processor 520, a memory 530, a storage component 540, an input component 550, an output component 560, and a communication interface 570.

Bus 510 includes a component that permits communication among the components of device 500. Processor 520 is implemented in hardware, firmware, or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a sensor for sensing information (e.g., a global positioning system (GPS) component, an accelerometer, a gyroscope, and/or an actuator). Output component 560 includes a component that provides output information from device 500 (e.g., a display, a speaker, and/or one or more light-emitting diodes (LEDs)).

Communication interface 570 includes a transceiver-like component (e.g., a transceiver and/or a separate receiver and transmitter) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, a radio frequency (RF) interface, a universal serial bus (USB) interface, a Wi-Fi interface, a cellular network interface, or the like.

Device 500 may perform one or more processes described herein. Device 500 may perform these processes based on to processor 520 executing software instructions stored by a non-transitory computer-readable medium, such as memory 530 and/or storage component 540. A computer-readable medium is defined herein as a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method for producing a semiconductor device, comprising:
   providing a virtual device under test (DUT) implemented as a behavior model of the semiconductor device; and
   developing at least one test in a test development environment for an automatic test equipment (ATE),
      wherein commands are generated by the test development environment,
      wherein first test signals, generated based on the commands, are fed to a real DUT,
      wherein first response signals are obtained from the real DUT based on the first test signals,
      wherein, after the first response signals are obtained, the commands are converted, by a software interface that functions as a virtual ATE, into second test signals that are processable by the virtual DUT,
      wherein the second test signals are fed to the virtual DUT, and
      wherein the software interface converts second response signals of the virtual DUT into data that is in a format readable by the test development environment and reports the data back to the test development environment.

2. The method as claimed in claim 1, further comprising:
   producing the semiconductor device after developing the at least one test; and
   carrying out an end-of-line test using the ATE,
      wherein the at least one test is used.

3. The method as claimed in claim 2, wherein the software interface emulates a behavior of the ATE used to carry out the end-of-line test.

4. The method as claimed in claim 1, further comprising:
   modifying the behavior model to eliminate a bug based on the bug occurring in the virtual DUT during development of the at least one test; and
   producing the semiconductor device based on modifying the behavior model.

5. The method as claimed in claim 1, wherein the behavior model is a SystemC model, executed on a workstation.

6. The method as claimed in claim 1, wherein the test development environment is executed on a different workstation than the behavior model.

7. The method as claimed in claim 1, further comprising:
   deriving a hardware model from the behavior model; and
   synthesizing a layout of the semiconductor device.

8. A system for testing a semiconductor device, comprising:
   a virtual device under test (DUT) implemented as a behavior model of the semiconductor device,
      the behavior model being executed on at least one processor;
   a test development environment, executed on a workstation, for an automatic test equipment (ATE) for programming at least one test; and
   a software interface configured to emulate a behavior of the ATE,
      wherein commands are generated by the test development environment,
      wherein first test signals, generated based on the commands, are fed to a real DUT,
      wherein first response signals are obtained from the real DUT based on the first test signals,
      wherein, after the first response signals are obtained, the commands are converted by the software interface into second test signals that are processable by the virtual DUT,
      wherein the second test signals are fed to the virtual DUT, and
      wherein the software interface is further configured to convert second response signals of the virtual DUT into data that is in a format readable by the test development environment and to report the data back to the test development environment.

9. The system as claimed in claim 8, wherein the behavior model is a SystemC model, executed on the workstation.

10. The system as claimed in claim 9, wherein the at least one processor, which executes the behavior model, is part of another workstation.

11. The system as claimed in claim 8, wherein the software interface comprises an application programming interface (API) between the test development environment and the behavior model.

12. The system as claimed in claim 8, wherein the commands designate a signal frequency associated with the second test signals.

13. The system as claimed in claim 8, wherein the commands designate one or more of:
   a signal frequency change associated with the second test signals, or
   a signal phase associated with the second test signals.

14. A non-transitory computer-readable medium storing instructions, the instructions comprising:
   one or more instructions that, when executed by one or more processors, cause the one or more processors to:
      provide a virtual device under test (DUT) implemented as a behavior model of a semiconductor device; and
      develop at least one test in a test development environment for an automatic test equipment (ATE),
         wherein commands are generated by the test development environment,
         wherein first test signals, generated based on the commands, are fed to a real DUT,
         wherein first response signals are obtained from the real DUT based on the first test signals,
         wherein, after the first response signals are obtained, the commands are converted, by a software interface that functions as a virtual ATE, into second test signals that are processable by the virtual DUT,
         wherein the second test signals are fed to the virtual DUT, and
         wherein the software interface converts second response signals of the virtual DUT into data that is in a format readable by the test development environment and reports the data back to the test development environment.

15. The non-transitory computer-readable medium of claim 14, wherein the one or more instructions, when executed by the one or more processors, further cause the one or more processors to:
   produce the semiconductor device after developing the at least one test; and
   carry out an end-of-line test using the ATE,
      wherein the at least one test is used.

16. The non-transitory computer-readable medium of claim 15, wherein the software interface emulates a behavior of the ATE used to carry out the end-of-line test.

17. The non-transitory computer-readable medium of claim 14, wherein the one or more instructions, when executed by the one or more processors, further cause the one or more processors to:
   modify the behavior model to eliminate a bug based on the bug occurring in the virtual DUT during development of the at least one test; and
   produce the semiconductor device based on modifying the behavior model.

18. The non-transitory computer-readable medium of claim 14, wherein the behavior model is a SystemC model executed on a workstation.

19. The non-transitory computer-readable medium of claim 14, wherein the test development environment is executed on a different workstation than the behavior model.

20. The non-transitory computer-readable medium of claim 14, wherein the one or more instructions, when executed by the one or more processors, further cause the one or more processors to:
   derive a hardware model from the behavior model; and
   synthesize a layout of the semiconductor device.

* * * * *